US012787718B2

(12) United States Patent
Nakashima et al.

(10) Patent No.: US 12,787,718 B2
(45) Date of Patent: Nov. 3, 2026

(54) METHOD OF MANUFACTURING SEMICONDUCTOR DEVICE AND SEMICONDUCTOR MANUFACTURING DEVICE

(71) Applicant: Mitsubishi Electric Corporation, Tokyo (JP)

(72) Inventors: Kazutoshi Nakashima, Tokyo (JP); Yuji Nojiri, Tokyo (JP); Takaya Noguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 402 days.

(21) Appl. No.: 18/601,117

(22) Filed: Mar. 11, 2024

(65) Prior Publication Data

US 2024/0404892 A1 Dec. 5, 2024

(30) Foreign Application Priority Data

May 30, 2023 (JP) ................................ 2023-088382

(51) Int. Cl.
*H01L 21/66* (2006.01)
*H10P 54/00* (2026.01)
*H10P 74/20* (2026.01)

(52) U.S. Cl.
CPC ............ *H10P 74/207* (2026.01); *H10P 54/00* (2026.01)

(58) Field of Classification Search
CPC ...... H10P 54/00; H10P 74/203; H10P 74/207; H10P 74/23
See application file for complete search history.

(56) References Cited

U.S. PATENT DOCUMENTS 5,787,190 A * 7/1998 Peng ........................ H10P 74/23 438/10
2006/0025956 A1* 2/2006 Satake .................. H10P 74/203 257/E21.53
2015/0279786 A1* 10/2015 Matsumoto ........... H10W 46/00 257/529

FOREIGN PATENT DOCUMENTS

JP 2002-184819 A 6/2002

* cited by examiner

*Primary Examiner* — Jaehwan Oh
(74) *Attorney, Agent, or Firm* — Studebaker Brackett PLLC

(57) ABSTRACT

Acquired in a data acquisition process is a test result of an electrical test performed on a plurality of semiconductor chips. The test result is associated with arrangement information of the plurality of semiconductor chips. In a cutting process, a semiconductor wafer is cut based on a base point set in the semiconductor wafer. Identified in an identification process is a non-defective semiconductor chip or a defective semiconductor chip in a semiconductor wafer on which cutting processing has been performed based on appearance information of the semiconductor wafer on which the cutting processing has been performed and the test result of the semiconductor wafer before the cutting processing. The semiconductor wafer on which the cutting processing has been performed includes two or more semiconductor chips. The appearance information is an image of a region including the base point.

17 Claims, 9 Drawing Sheets

METHOD OF MANUFACTURING SEMICONDUCTOR DEVICE AND SEMICONDUCTOR MANUFACTURING DEVICE

BACKGROUND OF THE INVENTION

Field of the Invention

The present disclosure relates to a method of manufacturing a semiconductor device and a semiconductor manufacturing device.

Description of the Background Art

Important is a technique to make positional information of a semiconductor chip in map data outputted as a result of an electrical test of a semiconductor element and positional information of a large number of semiconductor chips actually formed in a semiconductor wafer coincide with each other accurately to correctly separate a non-defective semiconductor chip and a defective semiconductor chip. Japanese Patent Application Laid-Open No. 2002-184819 proposes a technique of preparing a reference pellet provided with an ink mark in a non-formation region where a semiconductor element is not formed and inspecting a non-defective pellet and a defective pellet in accordance with a coordinate based on the reference pellet.

SUMMARY

The marking technique by ink described above makes management in a process of manufacturing the semiconductor device difficult. For example, it is necessary to select ink appropriate for marking such as drying and removing the ink and manage a process development. Required is easy and correct separation of a non-defective semiconductor chip and a defective semiconductor chip without using ink.

An object of the present disclosure is to provide a method of manufacturing a semiconductor device capable of easily and correctly separating a non-defective semiconductor chip and a defective semiconductor chip.

A method of manufacturing a semiconductor device according to the present disclosure includes a data acquisition process, a cutting process, and an identification process. The data acquisition process acquires a test result of an electrical test performed on a plurality of semiconductor chips formed in a semiconductor wafer. The test result is associated with arrangement information of the plurality of semiconductor chips. The cutting process cuts the semiconductor wafer based on a base point set in the semiconductor wafer to form a semiconductor wafer on which cutting processing has been performed. The identification process identifies at least one of a non-defective semiconductor chip and a defective semiconductor chip in the semiconductor wafer on which the cutting processing has been performed based on appearance information of the semiconductor wafer on which the cutting processing has been performed and the test result of the semiconductor wafer before the cutting processing. The semiconductor wafer on which the cutting processing has been performed includes two or more semiconductor chips. The appearance information is an image of a region including the base point.

Provided is a method of manufacturing a semiconductor device capable of easily and correctly separating a non-defective semiconductor chip and a defective semiconductor chip.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
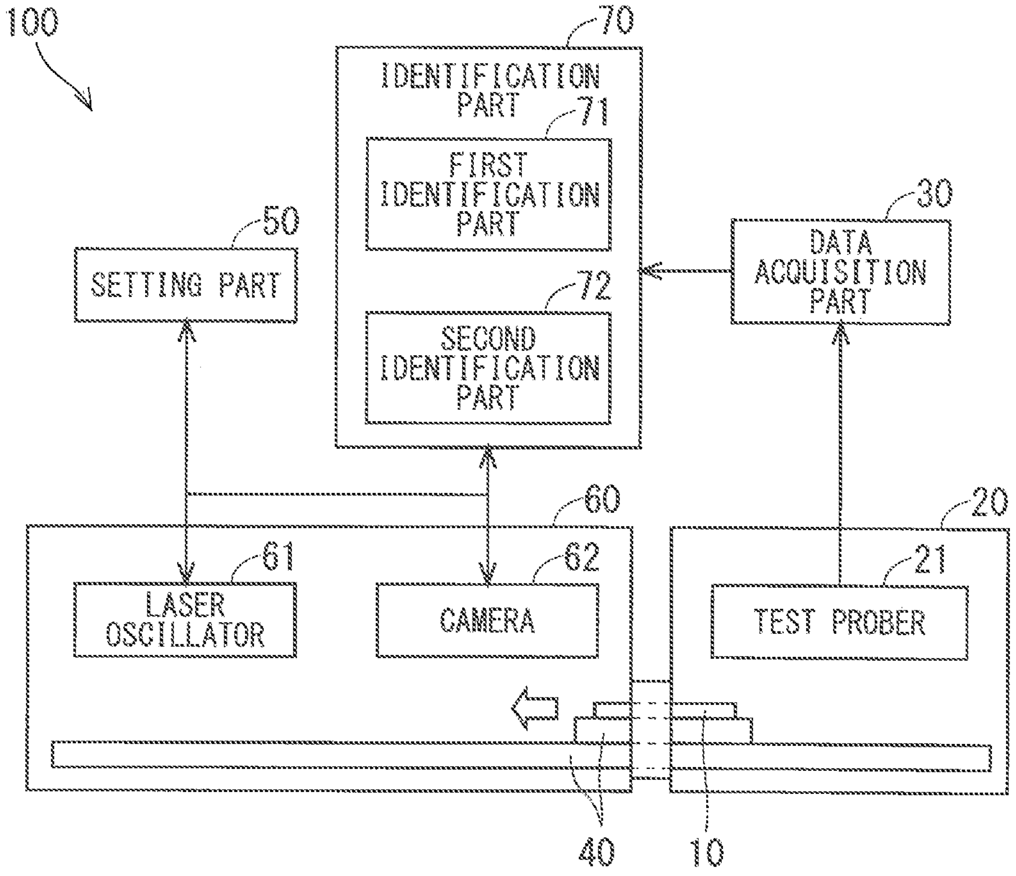
FIG. 1 is a diagram illustrating a configuration of a semiconductor manufacturing device according to an embodiment 1.
Figure 2:
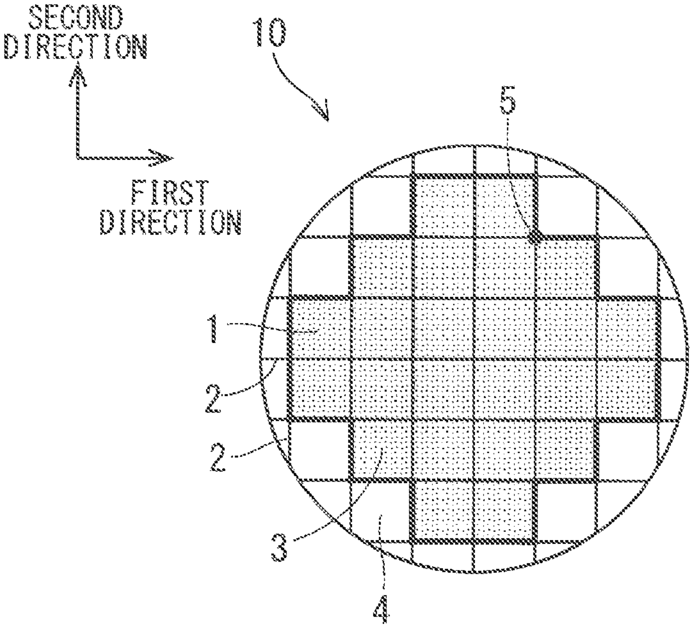
FIG. 2 is a diagram illustrating a configuration of a semiconductor device to be tested.

FIG. 1 is a diagram illustrating a configuration of a semiconductor manufacturing device 100 according to an embodiment 1. FIG. 2 is a diagram illustrating a configuration of a semiconductor wafer 10 according to an embodiment 1. The semiconductor manufacturing device 100 performs an electrical test on a plurality of semiconductor chips 1 formed in the semiconductor wafer 10.

The plurality of semiconductor chips 1 are disposed in a matrix along a first direction and a second direction in a surface of the semiconductor wafer 10. The second direction is a direction perpendicular to the first direction. Dicing lines 2 extending in the first direction and the second direction are defined between the plurality of semiconductor chips 1. The plurality of semiconductor chips 1 are separated from each other along the dicing lines 2 in a dicing process described hereinafter. A planar shape of each semiconductor chip 1 is a rectangular shape. The semiconductor wafer 10 includes an effective region 3 and an ineffective region 4. The effective region 3 corresponds to a region where the semiconductor chip 1 is formed. The ineffective region 4 is located on an outer side of the effective region 3, and corresponds to a region where the semiconductor chip 1 is not formed.

The semiconductor chip 1 is formed of a semiconductor such as Si, for example. The semiconductor chip 1 is preferably formed of a so-called wide bandgap semiconductor such as SiC, GaN, $Ga_2O_3$, or diamond. The semiconductor chip 1 includes a diode element or a switching element as a semiconductor element (not shown). The diode element is a Schottky barrier diode, for example. The switching element is an insulated gate bipolar transistor (IGBT) or a metal oxide semiconductor field effect transistor (MOSFET).

The semiconductor manufacturing device 100 includes a wafer test part 20, a data acquisition part 30, a transfer part 40, a setting part 50, a cutting part 60, and an identification part 70.

The wafer test part 20 includes a test prober 21. The wafer test part 20 applies current or voltage to each of the plurality of semiconductor chips 1, and evaluates electrical characteristics of the semiconductor chips 1 to perform an electrical test. The current or the voltage is applied via a probe (not shown) of the test prober 21. The wafer test part 20 outputs the evaluation result as a test result of the electrical test of the semiconductor chip 1.

The test result is associated with arrangement information of the plurality of semiconductor chips 1. For example, the test result is wafer map data. The wafer map data includes positional information of the semiconductor wafer 10 for at least one of a non-defective semiconductor chip and a defective semiconductor chip. In other words, the test result includes determination information and positional information of at least one of the non-defective semiconductor chip and the non-defective semiconductor chip. The determination information of the defective semiconductor chip is expressed as "x" in the wafer map data, for example. The test result stores not only the positional information of the non-defective semiconductor chip or the defective semiconductor chip but also arrangement information of the plurality of semiconductor chips 1, that is to say, whole arrangement information The positional information and the arrangement information are coordinate data of the semiconductor chip 1, for example.

The data acquisition part 30 acquires the test result of the electrical test performed on the plurality of semiconductor chips 1 formed in the semiconductor wafer 10.

The transfer part 40 includes a carrier holding the semiconductor wafer 10 and a transport stage transporting the carrier with high accuracy, for example. The transfer part 40 moves between the wafer test part 20 and the cutting part 60.

The setting part 50 sets a base point 5 serving as a reference at a time of cutting the semiconductor wafer 10 in a cutting process described hereinafter in the semiconductor wafer 10. The base point 5 is a reference of a cutting section. The base point 5 is set on the dicing line 2, for example. The base point 5 may also be set on lines connecting a plurality of positioning marks used for an overlapping operation at a time of photolithography (photograving). The base point 5 corresponds to a point at which those lines intersect with each other. The base point 5 is preferably set to a corner part of a semiconductor chip formed on an outer peripheral side of the semiconductor wafer 10 in the plurality of semiconductor chips 1 formed in the effective region 3. The base point 5 is preferably set to a corner part of a semiconductor chip formed on an outermost side in the effective region 3. The base point 5 is set to such a position, thus the non-defective semiconductor chip in the effective region 3 is not cut in the cutting process. The cutting section is set to a minimum. Even when the semiconductor wafer 10 has a large diameter such as 8 inches or 12 inches, the cutting section is minimized.

Figure 3:
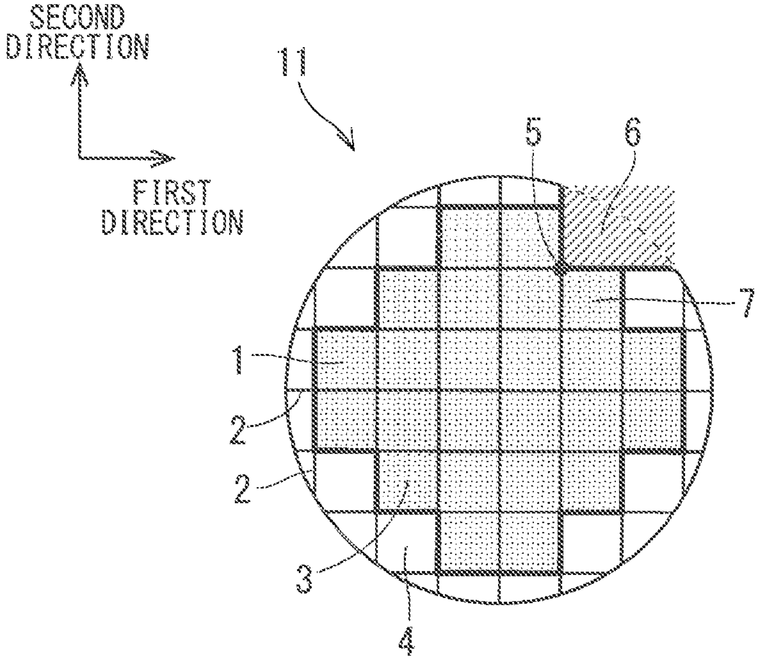
FIG. 3 is a diagram illustrating a configuration of a semiconductor wafer on which cutting processing has been performed according to the embodiment 1.

The cutting part 60 performs the cutting process and the dicing process. In the cutting process, the cutting part 60 cuts the semiconductor wafer 10 based on the base point 5 set in the semiconductor wafer 10. The semiconductor wafer 10 which has been cut is hereinafter referred to as a semiconductor wafer on which the cutting processing has been performed. FIG. 3 is a diagram illustrating a configuration of the semiconductor wafer 11 on which the cutting processing has been performed according to the embodiment 1. The semiconductor wafer 11 on which the cutting processing has been performed includes two or more semiconductor chips 1. The semiconductor wafer 11 on which the cutting processing has been performed preferably includes all of the plurality of semiconductor chips 1 formed in the semiconductor wafer 10 before the cutting process. The cutting part 60 according to the embodiment 1 cuts the semiconductor wafer 10 from the base point 5 to an end portion of the semiconductor wafer 10. A cross-sectional surface in the semiconductor wafer 11 on which the cutting processing has been performed is formed in the first direction and the second direction from the base point 5. A cutting direction in the embodiment 1 preferably follows the first direction and the second direction as an arrangement direction of the semiconductor chips 1, but is not limited thereto. In the dicing process, the cutting part 60 dices the semiconductor wafer 11 on which the cutting processing has been performed to separate the plurality of semiconductor chips 1 from each other.

The cutting part 60 includes a laser oscillator 61 and a camera 62. The laser oscillator 61 cuts the semiconductor wafer 10 or the semiconductor wafer 11 on which the cutting processing has been performed with laser as described above. The laser oscillator 61 is YAG laser, for example. The cutting part 60 may include a blade (not shown). The semiconductor wafer 10 may be cut by the blade. However, cutting by the blade has a limitation on a cutting width. This limitation is caused by a size of particles of diamond included in the blade and mechanical strength of the blade. The blade has direct contact with the semiconductor wafer 10, thus a crack may occur in the semiconductor chip 1 by vibration and impact at the time of cutting the semiconductor wafer 10. Thus, preferable is cutting by laser capable of cutting the semiconductor wafer 10 without having contact therewith and reducing the cutting width as much as possible. The camera 62 takes an image including the base point 5 in the semiconductor wafer 11 on which the cutting processing has been performed. For example, the camera 62 takes an image including at least one semiconductor chip 1 located around the base point 5 and a cutting section 6 cut based on the base point 5. At this time, the camera 62 may automatically recognize the cutting section 6 with the camera 62 and take an image of a region including the base point 5 and the semiconductor chip 1, or may also acquire information of the base point 5 from the setting part 50 and take an image of a region including the base point 5 and the semiconductor chip 1.

The identification part 70 identifies at least one of the non-defective semiconductor chip and the defective semiconductor chip in the semiconductor wafer 11 on which the cutting processing has been performed based on the appearance information of the semiconductor wafer 11 on which the cutting processing has been performed and the test result of the semiconductor wafer 10 before the cutting processing. The appearance information is the image described above. The identification part 70 according to the embodiment 1 includes a first identification part 71 and a second identification part 72.

The first identification part 71 checks presence or absence of the semiconductor chip 1 in a predetermined range around the base point 5 based on the image described above as the appearance information and the arrangement information of the plurality of semiconductor chips 1 in the test result. The predetermined range is an optional range and can be changed. The determination of presence or absence of the semiconductor chip 1 in the image is performed by image analysis. The image analysis is performed based on shape information and area information of the semiconductor chip 1 and color information of a dicing sheet and the semiconductor chip 1, for example. Then, the identification part 70 specifies a reference chip 7 in the predetermined range. the reference chip 7 may be the semiconductor chip 1 or a chip in the ineffective region 4. The chip in the ineffective region 4 corresponds to a region defined by the plurality of dicing lines 2 extending in the ineffective region 4.

The second identification part 72 identifies a position of at least one of the non-defective semiconductor chip and the defective semiconductor chip in the semiconductor wafer 11 on which the cutting processing has been performed based on the reference chip 7.

Each function of the data acquisition part 30, the setting part 50, the first identification part 71, and the second identification part 72 is achieved by a processing circuit (not shown) included in the semiconductor manufacturing device 100. The processing circuit includes a processor and a memory, for example. When the processor executes a program stored in the memory, each function of the data acquisition part 30, the setting part 50, the first identification part 71, and the second identification part 72 is achieved.

Figure 4:
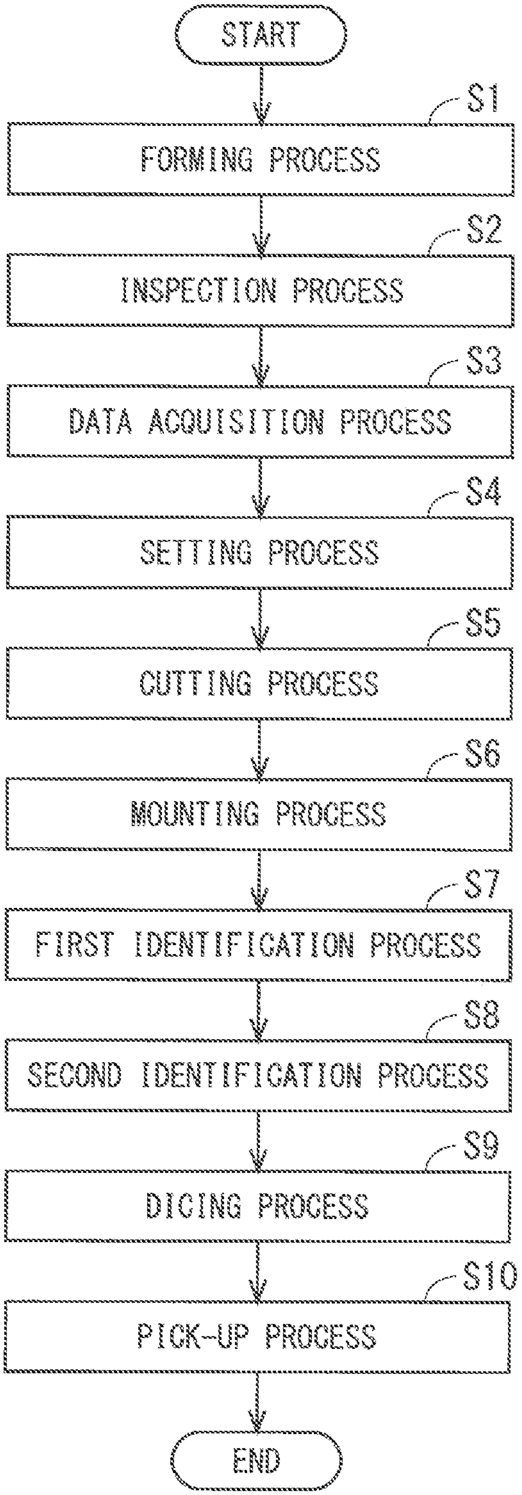
FIG. 4 is a flow chart illustrating a method of manufacturing the semiconductor device according to the embodiment 1.

FIG. 4 is a flow chart illustrating the method of manufacturing the semiconductor device according to the embodiment 1.

Step S1 is a forming process. In Step S1, the plurality of semiconductor chips 1 are formed in the semiconductor wafer 10. The semiconductor chips 1 are disposed in a matrix along the first direction and the second direction.

Step S2 is an inspection process. The wafer test part 20 performs an electrical test on each of the plurality of semiconductor chips 1 formed in the semiconductor wafer 10. At this time, the current or the voltage is applied to each semiconductor chip 1 via the probe of the test prober 21. The wafer test part 20 detects the non-defective semiconductor chip or the defective semiconductor chip.

Step S3 is a data acquisition process. The data acquisition part 30 acquires the test result of the electrical test. The test result is associated with the arrangement information of the plurality of semiconductor chips 1. The test result is wafer map data. The wafer map data includes determination information and positional information of the defective semiconductor chip. The wafer map data also stores the arrangement information of the plurality of semiconductor chips 1.

Step S4 is a setting process. The setting part 50 sets the base point 5 serving as the reference at the time of cutting the semiconductor wafer 10 in a subsequent cutting process in the semiconductor wafer 10. The base point 5 in the embodiment 1 is set to a point on at which two dicing lines 2 intersect with each other. As illustrated in FIG. 2, the base point 5 is set to a corner part of the semiconductor chip formed on an outer peripheral side of the semiconductor wafer 10 in the plurality of semiconductor chips 1 in the effective region 3.

Step S5 is a cutting process. The cutting part 60 cuts the semiconductor wafer 10 based on the base point 5 set in the semiconductor wafer 10 to form the semiconductor wafer 11 on which the cutting processing has been performed. The semiconductor wafer 11 on which the cutting processing has been performed includes two or more semiconductor chips 1. In the embodiment 1, the cutting part 60 cuts the semiconductor wafer 10 from the base point 5 to the end portion of the semiconductor wafer 10 as illustrated in FIG. 3. At this time, the cutting part 60 cuts the semiconductor wafer 10 along the first direction and the second direction. The semiconductor wafer 10 is cut by YAG laser, for example. The cross-sectional surface is formed in the first direction and the second direction from the base point 5. According to this cutting process, the cutting section 6 as a part of the semiconductor wafer 10 is separated to form the semiconductor wafer 11 on which the cutting processing has been performed.

Step S6 is a mounting process. The semiconductor wafer 11 on which the cutting processing has been performed is mounted on a dicing sheet (not shown). A tape (not shown) supported by a ring frame (not shown) is attached to one main surface of the semiconductor wafer 11 on which the cutting processing has been performed.

Step S7 is a first identification process. The camera 62 takes the image including at least one semiconductor chip 1 located around the base point 5 and the cutting section 6 cut based on the base point 5 in the semiconductor wafer 11 on which the cutting processing has been performed.

The first identification part 71 checks presence or absence of the semiconductor chip 1 in the predetermined range around the base point 5 based on the image and the arrangement information of the semiconductor chip 1. The first identification part 71 specifies the reference chip 7 in the predetermined range based on the check result. An example of the first identification process is described hereinafter.

Figure 5:
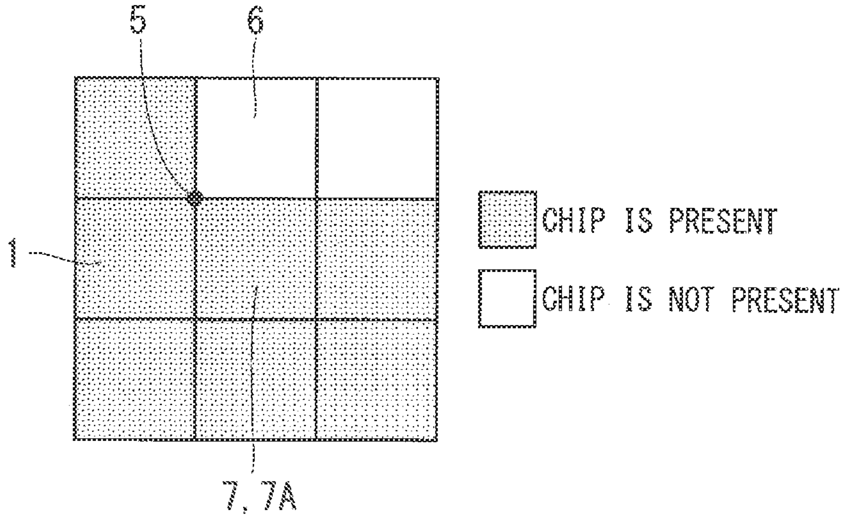
FIG. 5 is a diagram illustrating an example of a matrix search.

The first identification part 71 performs a matrix search on the predetermined range around the base point 5. FIG. 5 is a diagram illustrating an example of the matrix search. As an example, the predetermined range has the same size as a region where three semiconductor chips 1 are disposed in a lateral direction and a vertical direction. At this time, the first identification part 71 regulates the semiconductor chip 1 adjacent to the base point 5 as a temporal reference chip 7A. The first identification part 71 sets the predetermined range centering on the temporal reference chip 7A, and executes the matrix search. Specifically, the first identification part 71 acquires the information regarding presence or absence of the semiconductor chip 1 in the range by the image analysis. As illustrated in FIG. 5, the semiconductor chip 1 is not provided on an upper side and a right-upper side of a center part of the region. The semiconductor chip 1 is provided in the other region. The arrangement information of the plurality of semiconductor chips 1 in the electrical test is stored in the wafer map data acquired by the first identification part 71 as the test result. The first identification part 71 checks the result of the matrix search and the arrangement information thereof. When the result of the matric search and the arrangement information coincide with each other, the temporal reference chip 7A in a center of the search range is specified as the reference chip 7.

Step S8 is a second identification process. The second identification part 72 identifies a position of the non-defective semiconductor chip in the semiconductor wafer 11 on which the cutting processing has been performed based on the reference chip 7. For example, the second identification part 72 overlaps the position of the reference chip 7 with the arrangement information in the wafer map data to identify the semiconductor chip 1 other than the defective semiconductor chip, and specifies the positions thereof.

Step S9 is a dicing process. The cutting part 60 dices the semiconductor wafer 11 on which the cutting processing has been performed to separate the plurality of semiconductor chips 1 from each other.

Step S10 is a pick-up process. The non-defective semiconductor chip is accurately picked up from the plurality of semiconductor chips 1 based on the positional information of the non-defective semiconductor chip. The defective semiconductor chip drops out in this pick-up process.

According to the method of manufacturing the semiconductor device described above, the non-defective semiconductor chip and the defective semiconductor chip can be easily and correctly separated without using ink.

In the manufacturing method described above, the data acquisition part 30 acquires the information of the defective semiconductor chip, and the second identification part 72 identifies the non-defective semiconductor chip based on the information of the defective semiconductor chip. The test result acquired in the data acquisition part 30 may be information of the non-defective semiconductor chip or information of both the defective semiconductor chip and the non-defective semiconductor chip. The semiconductor chip 1 identified in the second identification part 72 may be the defective semiconductor chip, or may also be both the defective semiconductor chip and the non-defective semiconductor chip.

The first identification process and the second identification process are executed between the mounting process and the dicing process, but may also be executed after the dicing process. In such a case, the identification process is executed on the diced plurality of semiconductor chips 1. Even in such a case, the non-defective semiconductor chip is accurately picked up from the plurality of semiconductor chips 1.

The first identification process and the second identification process are examples of the function and the operation executed by the identification part 70, and are not limited thereto described above. The identification part 70 identifies at least one of the non-defective semiconductor chip and the defective semiconductor chip based on the appearance information of the semiconductor wafer 11 on which the cutting processing has been performed and the test result of the semiconductor wafer 10 before the cutting processing. It is sufficient that the appearance information is an image of the region including the base point 5, and is preferably an image including the semiconductor chip 1 located around the base point 5 and the cutting section 6. The identification part 70 analyzes the image, thereby being able to check the positional information of the semiconductor chip 1 in the image and the arrangement information in the test. The position of the non-defective semiconductor chip or the defective semiconductor chip is identified based on the check result.

In conclusion, the method of manufacturing the semiconductor device according to the embodiment 1 includes the data acquisition process, the cutting process, and the identification process. The data acquisition process acquires the test result of the electrical test performed on the plurality of semiconductor chips 1 formed in the semiconductor wafer 10. The test result is associated with the arrangement information of the plurality of semiconductor chips 1. The cutting process cuts the semiconductor wafer 1 based on the base point set 5 set in the semiconductor wafer 10 to form a semiconductor wafer 11 on which cutting processing has been performed. The identification process identifies at least one of the non-defective semiconductor chip and the defective semiconductor chip in the semiconductor wafer 11 on which the cutting processing has been performed based on the appearance information of the semiconductor wafer 11 on which the cutting processing has been performed and the test result of the semiconductor wafer 10 before the cutting processing. The semiconductor wafer 11 on which the cutting processing has been performed includes two or more semiconductor chips 1. The appearance information is the image of the region including the base point 5.

According to such a method of manufacturing the semiconductor device, the non-defective semiconductor chip and the defective semiconductor chip can be easily and correctly separated.

The process of separating the non-defective semiconductor chip and the defective semiconductor chip is performed without ink, thus the ink needs not to be managed. For example, a process of drying the ink is unnecessary, and a problem of detaching the ink in dicing does not occur. An operation of selecting new ink in accordance with end of life of the ink is also unnecessary. Increase in the diameter of the semiconductor wafer 10 and downsizing of the semiconductor chip 1 proceed, thus the number of the semiconductor chips 1 formed in one semiconductor wafer 10 increases. According to the manufacturing method in the embodiment 1, the process of applying the ink to the reference chip 7 or the defective semiconductor chip is unnecessary, thus load of the prober is reduced. A trouble that the ink flows out to the adjacent semiconductor chip 1 does not also occur.

In the mounting process, the dicing sheet expands when the semiconductor wafer 10 is mounted on the dicing sheet. An outer peripheral part of the semiconductor wafer 10 extends more easily by the influence of expanding than a center part thereof. A center deviation and a θ deviation of the semiconductor wafer 10 unintentionally occur. A deviation occurs between the positional information of the semiconductor chip 1 which is previously registered and actual positional information. Such a deviation has influence on accuracy of separating the non-defective semiconductor chip and the defective semiconductor chip. However, in the manufacturing method according to the embodiment 1, recognition accuracy of the position of the semiconductor chip 1 on the dicing sheet is improved, thus it is possible to easily and correctly separate the non-defective semiconductor chip and the defective semiconductor chip. Thus, productivity in the process of manufacturing the semiconductor device is improved.

Embodiment 2

In the embodiment 2, the same reference numerals are assigned to constituent elements similar to those in the embodiment 1, and the detailed description thereof is omitted.

Figure 6:
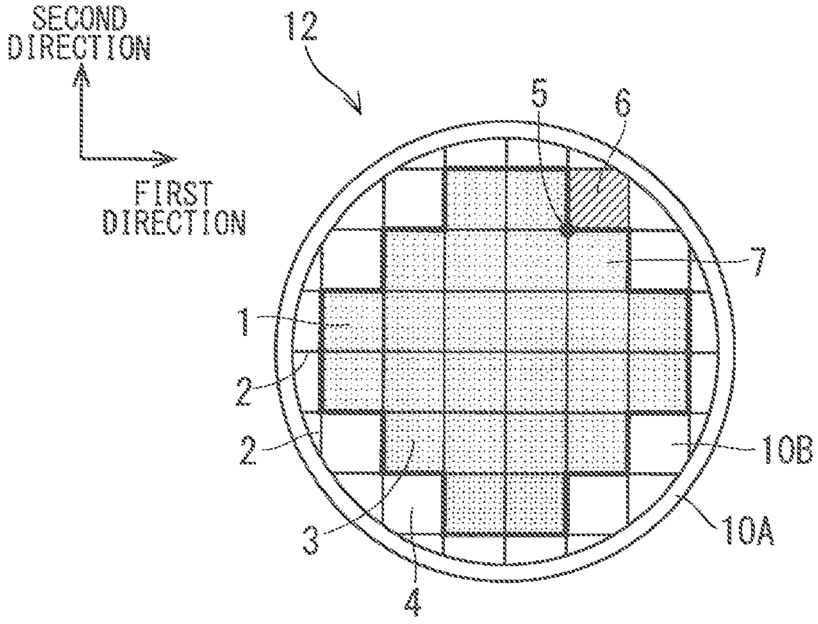
FIG. 6 is a diagram illustrating a configuration of a semiconductor wafer on which cutting processing has been performed according to an embodiment 2.

FIG. 6 is a diagram illustrating a configuration of the semiconductor wafer 12 on which the cutting processing has been performed according to the embodiment 2. The semiconductor wafer 10 is a semiconductor wafer with a rim. The semiconductor wafer with the rim includes a rim part 10A and a center part 10B. The rim part 10A is provided along an outer periphery of the semiconductor wafer with the rim. The center part 10B is provided on an inner side of the rim part 10A. A thickness of the rim part 10A is larger than that of the center part 10B.

A cutting process in the embodiment 2 includes a cutting section forming process and a rim cutting process. In the cutting section forming process, the cutting part 60 cuts out the cutting section 6 which is a region located in the center part 10B to be adjacent to the base point 5. The base point 5 is set in the setting process in the manner similar to that in the embodiment 1. The cutting section 6 is preferably located in the ineffective region 4 provided to an outer side of the effective region 3 where the semiconductor chip 1 is formed. The cutting section 6 may be cut along the dicing line 2 to have the same chip shape as the semiconductor chip 1. In the rim cutting process, the cutting part 60 cuts the rim part 10A. The other process is similar to that in the embodiment 1.

A thickness of the rim part 10A is larger than that of the center part 10B in the semiconductor wafer with the rim. Thus, it is difficult for the cutting part 60 to cut the semiconductor wafer 10 from the base point 5 to the end portion of the semiconductor wafer 10. According to the method of manufacturing the semiconductor device in the embodiment 2, the cutting section 6 located around the base point 5 is cut out, thus the reference chip 7 is specified in the manner similar to the embodiment 1. Prevented is the deviation of the wafer map data from the actual positional information at the time of identifying the defective semiconductor chip. Thus, productivity in the process of manufacturing the semiconductor device is improved.

Embodiment 3

In the embodiment 3, the same reference numerals are assigned to constituent elements similar to those in the embodiment 1 or 2, and the detailed description thereof is omitted.

Figure 7:
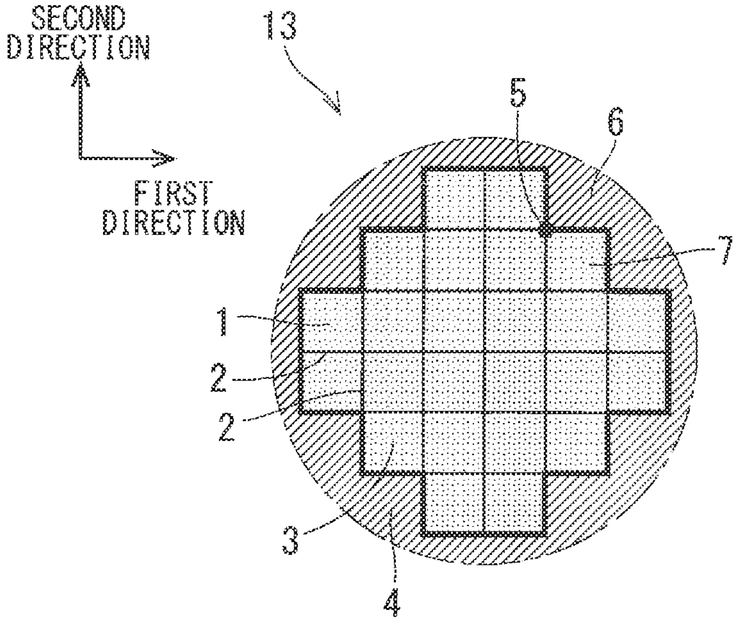
FIG. 7 is a diagram illustrating a configuration of a semiconductor wafer on which cutting processing has been performed according to an embodiment 3.

FIG. 7 is a diagram illustrating a configuration of a semiconductor wafer 13 on which the cutting processing has been performed according to the embodiment 3. In the cutting process, the cutting part 60 cuts the semiconductor wafer at a boundary between the effective region 3 and the ineffective region 4 based on the base point 5. That is to say, the ineffective region 4 where the semiconductor chip 1 is not formed is wholly cut out in the cutting process.

According to the method of manufacturing the semiconductor device in the embodiment 3, phenomenon of picking up the chip in the ineffective region 4 in the pick-up process cannot occur. Outflow of the chip in the ineffective region 4 is prevented. In this manufacturing method, the chip in an outer side of the effective region 3, that is to say, the chip in the ineffective region 4 cannot be set to the reference chip 7. The reference chip 7 is specified in the effective region 3. Thus, when the non-defective semiconductor chip is picked up in the pick-up process, the reference chip 7 is preferably picked up at the end.

Embodiment 4

In the embodiment 4, the same reference numerals are assigned to constituent elements similar to those in any of the embodiments 1 to 3, and the detailed description thereof is omitted.

Figure 8:
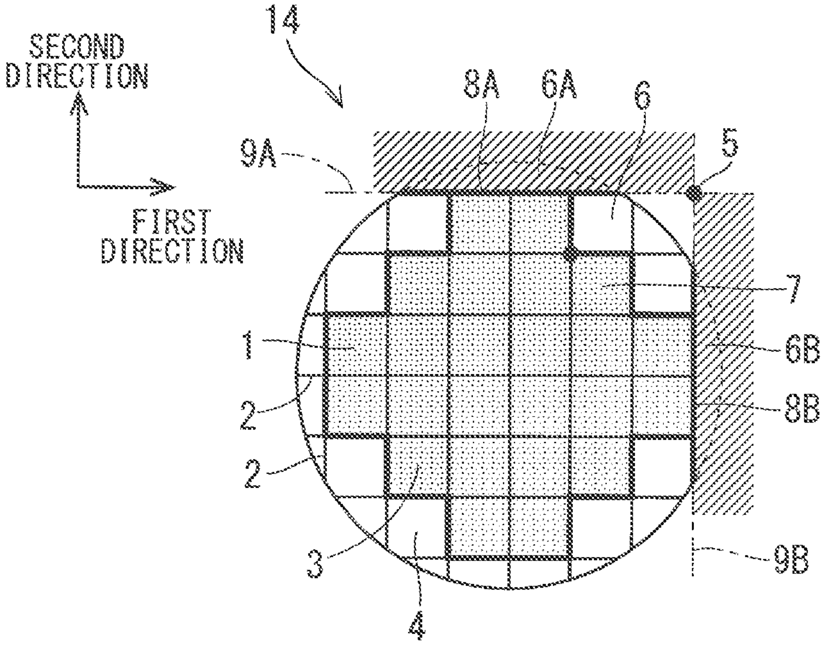
FIG. 8 is a diagram illustrating a configuration of a semiconductor wafer on which cutting processing has been performed according to an embodiment 4.

FIG. 8 is a diagram illustrating a configuration of a semiconductor wafer 14 on which the cutting processing has been performed according to the embodiment 4. The semiconductor wafer 10 includes the effective region 3 and the ineffective region 4.

The boundary between the effective region 3 and the ineffective region 4 includes a first boundary part 8A extending in the first direction and a second boundary part 8B extending in the second direction. The first boundary part 8A is located between the semiconductor chip in the plurality of semiconductor chips 1 closest to an outer periphery of the semiconductor wafer 10 in the second direction and the ineffective region 4. The second boundary part 8B is located between the semiconductor chip in the plurality of semiconductor chips 1 closest to an outer periphery of the semiconductor wafer 10 in the first direction and the ineffective region 4.

The base point 5 in the embodiment 4 is set to a point of intersection between a first virtual line 9A formed by virtually extending the first boundary part 8A and a second virtual line 9B formed by virtually extending the second boundary part 8B.

In the setting process, it is applicable that the setting part 50 detects the first boundary part 8A and the second boundary part 8B based on the image of the semiconductor wafer 10 taken with the camera 62 and automatically sets the point of intersection between the first virtual line 9A and the second virtual line 9B to the base point 5.

In the cutting process, the cutting part 60 cuts the semiconductor wafer 10 along the first virtual line 9A and the second virtual line 9B. The cutting process includes a first cutting process and a second cutting process. In the first cutting process, the cutting part 60 cuts the semiconductor wafer 10 along the first virtual line 9A based on the base point 5. Accordingly, the first cutting section 6A as the end portion of the semiconductor wafer 10 is cut and divided. In the second cutting process, the semiconductor wafer 10 is cut along the second virtual line 9B. Accordingly, the second cutting section 6B as the end portion of the semiconductor wafer 10 is cut and divided.

In the first identification process, the first identification part 71 specifies the reference chip 7 based on the image including the first cutting section 6A and the second cutting section 6B centering on the base point 5 and the semiconductor chip 1 around the first and second cutting sections 6A and 6B as the image of the appearance information. At this time, the first identification part 71 specifies the reference chip 7 in the predetermined range based on the check result of the wafer map data and the image in the manner similar to the embodiment 1. In the embodiment 4, the first identification part 71 may specify the semiconductor chip 1 located within a predetermined distance from the base point 5 as the reference chip 7. The reference chip 7 is specified more simply by this method, and productivity in the process of manufacturing the semiconductor device is improved.

According to such a method of manufacturing the semiconductor device, a complicated cutting route is not necessary. The semiconductor wafer 14 on which the cutting processing has been performed is achieved by performing the cutting process twice. The first boundary part 8A and the second boundary part 8B have a long straight line in the boundary. A coordinate system is recognized from such a long straight line, thus the position of the non-defective semiconductor chip or the defective semiconductor chip is recognized with higher accuracy.

Embodiment 5

In the embodiment 5, the same reference numerals are assigned to constituent elements similar to those in any of the embodiments 1 to 4, and the detailed description thereof is omitted.

Figure 9:
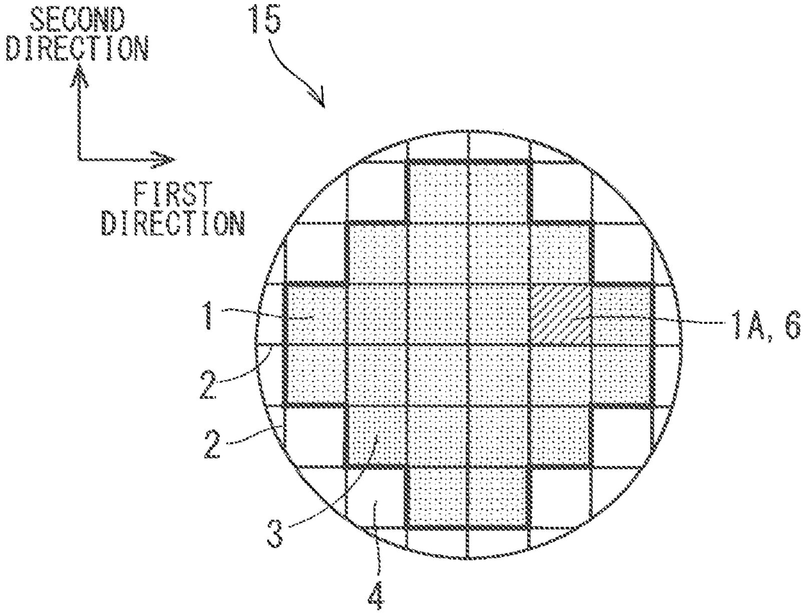
FIG. 9 is a diagram illustrating a configuration of a semiconductor wafer on which cutting processing has been performed according to an embodiment 5.

FIG. 9 is a diagram illustrating a configuration of a semiconductor wafer 15 on which the cutting processing has been performed according to the embodiment 5. In the cutting process, the cutting part 60 cuts only at least one defective semiconductor chip 1A based on the test result. More specifically, the cutting part 60 cuts out the defective semiconductor chip 1A which is determined to be defective in the inspection process and provided with a mark of “x”, for example, in the wafer map data. At this time, the cutting part 60 overlaps the wafer information which is previously registered with the wafer map acquired in the data acquisition process and check them, and specifies the defective semiconductor chip 1A.

If a positional deviation of the reference chip 7 occurs after the mounting process, the defective semiconductor chip 1A has been already cut out. There is no possibility of picking up the defective semiconductor chip 1A in the pick-up process, thus outflow of the defective semiconductor chip 1A is prevented.

In the present disclosure, each embodiment can be arbitrarily combined, or each embodiment can be appropriately varied or omitted.

The aspects of the present disclosure are collectively described hereinafter as appendixes.

APPENDIX 1

A method of manufacturing a semiconductor device, comprising:

a data acquisition step of acquiring a test result of an electrical test performed on a plurality of semiconductor chips formed in a semiconductor wafer to be associated with arrangement information of the plurality of semiconductor chips;

a cutting step of cutting the semiconductor wafer based on a base point set in the semiconductor wafer to form a semiconductor wafer on which cutting processing has been performed; and an identification step of identifying at least one of a non-defective semiconductor chip and a defective semiconductor chip in the semiconductor wafer on which the cutting processing has been performed based on appearance information of the semiconductor wafer on which the cutting processing has been performed and the test result of the semiconductor wafer before the cutting processing, wherein the semiconductor wafer on which the cutting processing has been performed includes two or more semiconductor chips, and the appearance information is an image of a region including the base point.

APPENDIX 2

The method of manufacturing the semiconductor device according to Appendix 1, wherein the image includes a semiconductor chip around the base point in the semiconductor wafer on which the cutting processing has been performed and a cutting section cut based on the base point.

APPENDIX 3

The method of manufacturing the semiconductor device according to Appendix 1 or 2, wherein the plurality of semiconductor chips are disposed in a matrix along a first direction and a second direction perpendicular to the first direction in a surface of the semiconductor wafer, and a cross-sectional surface in the semiconductor wafer on which the cutting processing has been performed is formed in the first direction and the second direction from the base point.

APPENDIX 4

The method of manufacturing the semiconductor device according to any one of Appendixes 1 to 3, wherein the cutting step includes cutting the semiconductor wafer from the base point to an end portion of the semiconductor wafer.

APPENDIX 5

The method of manufacturing the semiconductor device according to any one of Appendixes 1 to 4, wherein the semiconductor wafer is a semiconductor wafer with a rim, the semiconductor wafer with the rim includes a rim part provided along an outer periphery of the semiconductor wafer with the rim and a center part provided on an inner side of the rim part, a thickness of the rim part is larger than a thickness of the center part, and the cutting step includes:

a cutting section forming step of cutting out a cutting section which is a region located in the center part to be adjacent to the base point; and a rim cutting step of cutting the rim part.

APPENDIX 6

The method of manufacturing the semiconductor device according to any one of Appendixes 1 to 5, wherein the cutting step includes cutting the semiconductor wafer at a boundary between an effective region in which the plurality of semiconductor chips are formed and an ineffective region in which the plurality of semiconductor chips are not formed based on the base point.

APPENDIX 7

The method of manufacturing the semiconductor device according to Appendix 3, wherein the base point is set to a point of intersection between a first virtual line formed by virtually extending a first boundary part extending in the first direction and a second virtual line formed by virtually extending a second boundary part extending in the second direction in a boundary between an effective region in which the plurality of semiconductor chips are formed and an ineffective region in which the plurality of semiconductor chips are not formed, the first boundary part included in the first virtual line is located between a semiconductor chip closest to an outer periphery of the semiconductor wafer in the second direction and the ineffective region in the plurality of semiconductor chips, the second boundary part included in the second virtual line is located between a semiconductor chip closest to the outer periphery of the semiconductor wafer in the first direction and the ineffective region in the plurality of semiconductor chips, and the cutting step includes cutting the semiconductor wafer along the first virtual line and the second virtual line.

APPENDIX 8

The method of manufacturing the semiconductor device according to any one of Appendixes 1 to 7, wherein the cutting step includes cutting only the defective semiconductor chip based on the test result.

APPENDIX 9

The method of manufacturing the semiconductor device according to any one of Appendixes 1 to 8, further comprising:

a mounting step of mounting the semiconductor wafer on which the cutting processing has been performed is mounted on a dicing sheet; and a dicing step of dicing the semiconductor wafer on which the cutting processing has been performed and separating the plurality of semiconductor chips from each other after the mounting processing, wherein the identification step is executed between the mounting step and the dicing step or after the dicing step.

APPENDIX 10

The method of manufacturing the semiconductor device according to any one of Appendixes 1 to 9, wherein the identification step includes:

a first identification step of checking presence or absence of a semiconductor chip in a predetermined range around the base point and specifying a reference chip in the predetermined range based on the image and the arrangement information of the plurality of semiconductor chips in the test result; and a second identification step of identifying a position of at least one of the non-defective semiconductor chip and the defective semiconductor chip in the semiconductor wafer on which the cutting processing has been performed based on the reference chip.

APPENDIX 11

The method of manufacturing the semiconductor device according to any one of Appendixes 1 to 10, wherein the test result includes wafer map data including positional information on the semiconductor wafer for at least one of the non-defective semiconductor chip and the defective semiconductor chip.

APPENDIX 12

A semiconductor manufacturing device, comprising:

a data acquisition part acquiring a test result of an electrical test performed on a plurality of semiconductor chips formed in a semiconductor wafer to be associated with arrangement information of the plurality of semiconductor chips;

a cutting part cutting the semiconductor wafer based on a base point set in the semiconductor wafer to form a semiconductor wafer on which cutting processing has been performed; and an identification part identifying at least one of a non-defective semiconductor chip and a defective semiconductor chip in the semiconductor wafer on which the cutting processing has been performed based on appearance information of the semiconductor wafer on which the cutting processing has been performed and the test result of the semiconductor wafer before the cutting processing, wherein the semiconductor wafer on which the cutting processing has been performed includes two or more semiconductor chips, and the appearance information is an image of a region including the base point.

APPENDIX 13

The semiconductor device according to Appendix 12, wherein the image includes a semiconductor chip around the base point in the semiconductor wafer on which the cutting processing has been performed and a cutting section cut based on the base point.

APPENDIX 14

The semiconductor manufacturing device according to Appendix 12 or 13, wherein the plurality of semiconductor chips are disposed in a matrix along a first direction and a second direction perpendicular to the first direction in a surface of the semiconductor wafer, and a cross-sectional surface in the semiconductor wafer on which the cutting processing has been performed is formed in the first direction and the second direction from the base point.

APPENDIX 15

The semiconductor manufacturing device according to any one of Appendixes 12 to 14, wherein the identification part includes:

a first identification part checking presence or absence of a semiconductor chip in a predetermined range around the base point and specifying a reference chip in the predetermined range based on the image and the arrangement information of the plurality of semiconductor chips in the test result; and a second identification part identifying a position of at least one of the non-defective semiconductor chip and the defective semiconductor chip in the semiconductor wafer on which the cutting processing has been performed based on the reference chip.

APPENDIX 16

The semiconductor manufacturing device according to any one of Appendixes 12 to 15, wherein the test result includes wafer map data including positional information on the semiconductor wafer for at least one of the non-defective semiconductor chip and the defective semiconductor chip.

APPENDIX 17

The semiconductor manufacturing device according to any one of Appendixes 12 to 16, further comprising:

a wafer test part including a probe and applying current or voltage to each of the plurality of semiconductor chips via the probe to evaluate electrical characteristics, thereby performing the electrical test; and a transfer part moving the semiconductor wafer between the wafer test part and the cutting part, wherein the cutting part includes:

YAG laser cutting the semiconductor wafer; and a camera taking the image as the appearance information.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising:

a data acquisition step of acquiring a test result of an electrical test performed on a plurality of semiconductor chips formed in a semiconductor wafer to be associated with arrangement information of the plurality of semiconductor chips;

a cutting step of cutting the semiconductor wafer based on a base point set in the semiconductor wafer to form a semiconductor wafer on which cutting processing has been performed; and an identification step of identifying at least one of a non-defective semiconductor chip and a defective semiconductor chip in the semiconductor wafer on which the cutting processing has been performed based on appearance information of the semiconductor wafer on which the cutting processing has been performed and the test result of the semiconductor wafer before the cutting processing, wherein the semiconductor wafer on which the cutting processing has been performed includes two or more semiconductor chips, and the appearance information is an image of a region including the base point.

2. The method of manufacturing the semiconductor device according to claim 1, wherein the image includes a semiconductor chip around the base point in the semiconductor wafer on which the cutting processing has been performed and a cutting section cut based on the base point.

3. The method of manufacturing the semiconductor device according to claim 1, wherein the plurality of semiconductor chips are disposed in a matrix along a first direction and a second direction perpendicular to the first direction in a surface of the semiconductor wafer, and a cross-sectional surface in the semiconductor wafer on which the cutting processing has been performed is formed in the first direction and the second direction from the base point.

4. The method of manufacturing the semiconductor device according to claim 1, wherein the cutting step includes cutting the semiconductor wafer from the base point to an end portion of the semiconductor wafer.

5. The method of manufacturing the semiconductor device according to claim 1, wherein the semiconductor wafer is a semiconductor wafer with a rim, the semiconductor wafer with the rim includes a rim part provided along an outer periphery of the semiconductor wafer with the rim and a center part provided on an inner side of the rim part, a thickness of the rim part is larger than a thickness of the center part, and the cutting step includes:

a cutting section forming step of cutting out a cutting section which is a region located in the center part to be adjacent to the base point; and a rim cutting step of cutting the rim part.

6. The method of manufacturing the semiconductor device according to claim 1, wherein the cutting step includes cutting the semiconductor wafer at a boundary between an effective region in which the plurality of semiconductor chips are formed and an ineffective region in which the plurality of semiconductor chips are not formed based on the base point.

7. The method of manufacturing the semiconductor device according to claim 3, wherein the base point is set to a point of intersection between a first virtual line formed by virtually extending a first boundary part extending in the first direction and a second virtual line formed by virtually extending a second boundary part extending in the second direction in a boundary between an effective region in which the plurality of semiconductor chips are formed and an ineffective region in which the plurality of semiconductor chips are not formed, the first boundary part included in the first virtual line is located between a semiconductor chip closest to an outer periphery of the semiconductor wafer in the second direction and the ineffective region in the plurality of semiconductor chips, the second boundary part included in the second virtual line is located between a semiconductor chip closest to the outer periphery of the semiconductor wafer in the first direction and the ineffective region in the plurality of semiconductor chips, and the cutting step includes cutting the semiconductor wafer along the first virtual line and the second virtual line.

8. The method of manufacturing the semiconductor device according to claim 1, wherein the cutting step includes cutting only the defective semiconductor chip based on the test result.

9. The method of manufacturing the semiconductor device according to claim 1, further comprising:

a mounting step of mounting the semiconductor wafer on which the cutting processing has been performed is mounted on a dicing sheet; and a dicing step of dicing the semiconductor wafer on which the cutting processing has been performed and separating the plurality of semiconductor chips from each other after the mounting processing, wherein the identification step is executed between the mounting step and the dicing step or after the dicing step.

10. The method of manufacturing the semiconductor device according to claim 1, wherein the identification step includes:

a first identification step of checking presence or absence of a semiconductor chip in a predetermined range around the base point and specifying a reference chip in the predetermined range based on the image and the arrangement information of the plurality of semiconductor chips in the test result; and a second identification step of identifying a position of at least one of the non-defective semiconductor chip and the defective semiconductor chip in the semiconductor wafer on which the cutting processing has been performed based on the reference chip.

11. The method of manufacturing the semiconductor device according to claim 1, wherein the test result includes wafer map data including positional information on the semiconductor wafer for at least one of the non-defective semiconductor chip and the defective semiconductor chip.

12. A semiconductor manufacturing device, comprising:

a data acquisition circuitry acquiring a test result of an electrical test performed on a plurality of semiconductor chips formed in a semiconductor wafer to be associated with arrangement information of the plurality of semiconductor chips;

a cutting part cutting the semiconductor wafer based on a base point set in the semiconductor wafer to form a semiconductor wafer on which cutting processing has been performed; and an identification circuitry identifying at least one of a non-defective semiconductor chip and a defective semiconductor chip in the semiconductor wafer on which the cutting processing has been performed based on appearance information of the semiconductor wafer on which the cutting processing has been performed and the test result of the semiconductor wafer before the cutting processing, wherein the semiconductor wafer on which the cutting processing has been performed includes two or more semiconductor chips, and the appearance information is an image of a region including the base point.

13. The semiconductor manufacturing device according to claim 12, wherein the image includes a semiconductor chip around the base point in the semiconductor wafer on which the cutting processing has been performed and a cutting section cut based on the base point.

14. The semiconductor manufacturing device according to claim 12, wherein the plurality of semiconductor chips are disposed in a matrix along a first direction and a second direction perpendicular to the first direction in a surface of the semiconductor wafer, and a cross-sectional surface in the semiconductor wafer on which the cutting processing has been performed is formed in the first direction and the second direction from the base point.

15. The semiconductor manufacturing device according to claim 12, wherein the identification circuitry includes:

a first identification circuitry checking presence or absence of a semiconductor chip in a predetermined range around the base point and specifying a reference chip in the predetermined range based on the image and the arrangement information of the plurality of semiconductor chips in the test result; and a second identification circuitry identifying a position of at least one of the non-defective semiconductor chip and the defective semiconductor chip in the semiconductor wafer on which the cutting processing has been performed based on the reference chip.

16. The semiconductor manufacturing device according to claim 12, wherein the test result includes wafer map data including positional information on the semiconductor wafer for at least one of the non-defective semiconductor chip and the defective semiconductor chip.

17. The semiconductor manufacturing device according to claim 12, further comprising:

a wafer test part including a probe and applying current or voltage to each of the plurality of semiconductor chips via the probe to evaluate electrical characteristics, thereby performing the electrical test; and a transfer part moving the semiconductor wafer between the wafer test part and the cutting part, wherein the cutting part includes:

YAG laser cutting the semiconductor wafer; and a camera taking the image as the appearance information.

* * * * *